United States Patent
Lin et al.

(10) Patent No.: US 6,181,016 B1
(45) Date of Patent: Jan. 30, 2001

(54) BOND-PAD WITH A SINGLE ANCHORING STRUCTURE

(75) Inventors: Shi-Tron Lin; Chin-Jong Chan, both of Hsinchu (TW)

(73) Assignee: Winbond Electronics Corp, Hsinchu (TW)

(*) Notice: Under 35 U.S.C. 154(b), the term of this patent shall be extended for 0 days.

(21) Appl. No.: 09/327,877

(22) Filed: Jun. 8, 1999

(51) Int. Cl.⁷ ..................................... H01L 23/48
(52) U.S. Cl. ..................... 257/786; 257/758; 257/774
(58) Field of Search ............................... 257/786, 773, 257/774, 758, 782

(56) References Cited

U.S. PATENT DOCUMENTS 5,739,587 * 4/1998 Sato ..................................... 257/786

* cited by examiner

Primary Examiner—Roy Potter
(74) Attorney, Agent, or Firm—W. Wayne Liauh

(57) ABSTRACT

A bond pad structure for use in wire bonding applications during the packaging of semiconductor devices with reduced bond pad lift-off problem. It includes: (a) a laminated structure containing a metal bond pad layer, a dielectric layer, and an underlying layer formed on a wafer surface; and (b) a single anchoring structure formed in said dielectric layer connecting said metal bond pad layer and said underlying layer. The single anchoring structure contains a plurality of line segments that are interconnected so as to form said single anchoring structure. Unlike prior art anchoring structures, which always contain a plurality of anchors buried inside the dielectric, the bond pad structure contains only a single anchoring structure, which can have the geometry of an open or closed ring with whiskers, a coil, an open or closed square-waved ring, a tree structure, a grid-line structure, a meandering structure, a serpentine structure, a spiral structure, or a labyrinth. Furthermore, an array of dendritic sub-structures can be provided extending from an outer edge of the anchoring structure to further improve stability.

15 Claims, 8 Drawing Sheets

BOND-PAD WITH A SINGLE ANCHORING STRUCTURE

FIELD OF THE INVENTION

The present invention relates to a novel bond-pad structure for use in semiconductor packaging applications with improved stability and thus improved production yield. More specifically, the present invention relates to a novel bond-pad structure which eliminates or at least minimizes the bond-pad lift-off (or peeling-off) problems often experienced during the wire bonding step in the packaging of integrated circuits (ICs), while avoiding the drawbacks of the prior art methods intended for the same purpose. With the novel bond-pad structure of the present invention, the failure rate in production yield due to bond-pad lift-off can be substantially reduced without requiring major modifications in the fabrication process or facility. The present invention also relates to a novel process which implements the improved bond-pad design to increase the production yield so as to reduce the overall production costs for the manufacturing of integrated circuit packages, as well as to the printed circuit boards (PCBs) or other integrated circuit packages that incorporate the novel bond-pad structure disclosed herein.

BACKGROUND OF THE INVENTION

During the formation of printed circuit boards (PCBs) or other integrated circuit (IC) packaging processes, the semiconductor devices provided in the printed circuit board can be respectively connected to the outside via a wire-bonding process. In such a process, one or more bonding pads are provided which are in contact with respective parts of the semiconductive device at the outer-most conductive layer thereof. Then, a bonding wire is bonded onto the bond pad so as to allow the semiconductor device to make electric contact with the inner lead of the IC package.

Typically, the wire bonding process can be approximately categorized into two main types: the gold wire/gold ball bonding process and the aluminum wire wedge bonding process. The aluminum wire wedge bonding process is widely used in chip-on-board (COB) applications in which the aluminum wire is welded to the bond pad via a combination of ultrasonic vibrations and pressure applied to the wedge. The gold wire/gold ball bonding process is typically accomplished by pressing the wire, which is first formed into a ball, against the bond pad at an elevated temperature. The aluminum wire wedge bonding process is generally less accurate in establishing the bonding position and less uniform in the applied bonding pressure, and, hence, it is more prone to the bond peel-off problem relative to the gold wire/ball bonding process, mainly due to the non-uniformity of mechanical and/or thermal stresses.

The bond peel-off problem occurs when the adhesion force between any adjacent layers in the multi-layer structured semiconductor device is not strong enough to resist the thermal and mechanical stress that may be present during the wire bonding process to bond the bonding wire to the bond pad. This can occur, for example, between the metal bond pad and the underlying polysilicon layer, between a metal layer and a dielectric layer, between a dielectric layer and a polysilicon layer, and between a barrier layer and a dielectric layer, etc.

Bond-pad peeling-off or lift-off, in addition to that discussed above, has been a major unsettling problem besetting the integrated circuit packaging industry involving the wire bonding technology. Many possible solutions have been suggested and implemented, as illustrated in the following prior art references.

U. S. Pat. No. 4,060,828 discloses a semiconductor device having a multi-layer wiring structure with an additional through-hole interconnection formed in the insulating layer beneath the bonding pad of the wiring layer. The purpose of the '828 patent is to provide additional, and protected, electrical contact between the bonding pad and another wiring layer therebelow, such that if the exposed portion of the bonding pad is corroded and thus becoming disconnected, the additional electrical contact formed through the insulation layer can still provide the needed connection. While the '828 patent does not directly address the bond pad peel-off problem, the concept of providing a through-hole interconnection structure in the insulation layer immediately underlying the metal layer as disclosed in the '828 patent has been adopted, though mostly in modified form, by essentially all the prior art processes dealing with solving the problem of bond pad peel-off to provide an anchored structure.

U. S. Pat. No. 4,981,061 discloses a semiconductor device which comprises a first insulating layer formed on the major surface of the semiconductor substrate including an active region. A first contact hole is formed at a position in the first insulating layer corresponding to the active region and a first conductive layer is formed in the first contact hole and a portion of the first insulating layer around the contact hole. Then a second insulating layer is formed on the first conductive layer and the first insulating layer, and a second contact hole is formed at a position in the second insulating layer corresponding to the first conductive layer and located above the first contact hole. Subsequently, a second conductive layer is formed on the second insulating layer and fills the second contact hole. Finally a bonding wire is connected to the second conductive layer in regions located above the first and second contact holes. With the structure disclosed in the '061 patent, the pressure applied to the second insulating layer during wire bonding is supported by columnar portions of the first and second conductive layers filled in the first and second contact holes. Thus, the pressure acting on the second insulating layer is reduced to suppress occurrence of cracks.

U. S. Pat. No. 5,309,205 discloses a bond pad structure which is formed by depositing a barrier layer over an underlying region of a semiconductor device, and then depositing a first conductive layer over the barrier layer. The barrier layer and conductive layer are then patterned and etched to define a conductive region. In the '205 patent, the conductive region is formed in the shape of a grid, and a second conductive layer is deposited over the conductive region and a portion of the exposed underlying region. The second conductive layer makes a good adhesive contact with the underlying region, thus preventing bond pad lift off.

U.S. Pat. No. 5,248,903 discloses a bond pad structure which alleviates bond pad lift problems encountered during wire bonding by providing a composite bond pad, which includes an upper bond pad and a lower bond pad, and an insulating component therebetween. At least one opening is provided through the insulating component, extending from the bottom bond pad to the upper bond pad. The at least one opening is aligned with a peripheral region of the bottom bond pad. A conductive material is then provided which fills the plurality of openings, and electrically connects the top and bottom bond pads. The at least one opening can be a plurality of conductive vias, a ring-like opening extending around the peripheral region, or one or more elongated slit-like openings.

U.S. Pat. No. 5,309,025 discloses an improved bond pad structure which reduces bond pad lift off problems. The bond pad disclosed in the '025 patent includes a barrier layer, and is formed by first depositing a barrier layer over an underlying region of a semiconductor device, and then depositing a first conductive layer over the barrier layer. The barrier layer and the conductive layer are then patterned and etched to define a conductive region. A plurality of the conductive regions are formed each of which is isolated from the ourside by the formation of an insulative sidewall. A second conductive layer is deposited over the conductive region and a portion of the exposed underlying region. The second conductive layer makes a good adhesive contact with the underlying region, thus preventing bond pad lift off.

U.S. Pat. No. 5,707,894 discloses an improved bonding pad structure and the process for forming the same which reduces the bond pad peeling problem between the bonding pad layer and an underlying layer. The method disclosed in the '894 patent comprises the steps of first forming a plurality of anchor pads on the substrate surface in the bonding pad area. Next, a first insulating layer is formed over the substrate surface and the anchor pads. A plurality of via holes are formed through the first insulating layer which are filled with the same material as a second metal layer, which covers the first insulation layer, so as to form a conductive connection anchor pads and the second metal layer. The via holes have a smaller cross-sectional area than the anchor pads so that the combination of the anchor pads and the second metal form small "hooks" into the first insulating layer that hold the second metal layer (i.e., the bonding pad layer) to the underlying layer.

Essentially all of the inventions discussed above involve forming isolated multiple metal-filled holes or vias through the insulation layer underneath the portion of the bond pad where bonding wire is to be attached wherein the heat rise is expected to be high. The multiple metal-filled vias are not interconnected to each other except indirectly at the top through their respective connections to the metal layer. Since everything is scaled down proportionally, if the multiple metal-filled vias are not laid out properly, or if the wire bonding is not applied on the location as designed, unequal heat transfers from the metal bond pad layer in the different metal-filled vias can cause undesirable thermal stress problems. U.S. Pat. No. 5,248,903 discloses a ring-like anchoring structure between the upper bond pad and the lower bond pad of a composite bond pad structure. However, because of the relatively large distance between opposing sides of the ring structure, the unbalanced heat transfer problem still exists.

Furthermore, all of the prior art inventions discussed above failed to notice another important cause for the bond pad peel-off problems. It was observed by the co-inventors of the present invention that, very often, the bond pad peeling problem was found to be caused by cracks formed in or around one or more of the edge portions of the dielectric layer underlying corresponding portions of the metal bonding pad. Once a crack in the edge portion of the dielectric layer is formed due to the thermal and/or mechanical stress during the wire bonding process, it will propagate along the interface between the metal bonding pad and the dielectric layer, and eventually leading to the bond pad to be peeled off from the semiconductor device. Such a bond pad peel-off problem due to crack propagation becomes more profound as the bond pad size becomes smaller.

SUMMARY OF THE INVENTION

The primary object of the present invention is to develop an anchored bond pad structure for use in wire bonding applications during the packaging operation of integrated circuit devices, without introducing other unnecessary problems. More specifically, the primary object of the present invention is to develop an anchored bond pad structure which minimizes the lift-off problem without incurring problems that may be caused by the anchors themselves. One of the advantages of the present invention, over the prior art methods, is that it eliminates the potential unbalanced heat transfer problems that can be experienced associated with the use of the isolated multiple metal-filled anchors as utilized in the prior art anchored bond pads. In a further improved embodiment of the bond pad structure of the present invention, a novel edge strengthening dendritic sub-structure is provided which can provide enhanced adhesion as well as effectively stop the growth of cracks when they are formed in the edge portion of the dielectric layer adjacent to the bond pad. Crack growth is also another important reason contributing to the bond peel-off.

In the novel bond pad structure of the present invention, unlike any of the prior art augmented bond pad, a single anchoring structure is provided which is buried inside a dielectric layer and is in contact with an underlying layer, which can be a metal layer, a polysilicon layer, or other non-conducting or semiconducting layer with good adhesion to the anchoring structure. The single anchoring structure disclosed in the present invention contains a plurality of interconnected line segments (which can be a curve or a straight line). The interconnected line segments are of the same thickness, and generally are also of the same width. The anchoring structure provides enhanced contacting surface with the underlying layer, so as to provide improved adhesion for the metal bond pad material. Additionally, the anchoring structure also creates enhanced contacting surface (which is vertically extending) between the metal bond pad structure and the dielectric layer. This also increases the adhesion force therebetween.

The single anchoring structure of the present invention can assume a variety of shapes, such as an open-ring structure, a closed-ring structure, both of which with radiating whiskers, a circular or rectangular coil, an open or closed square-waved ring, a tree structure, a grid-line structure, a meandering structure, a serpentine structure, a spiral structure, a labyrinth, etc. One of the key elements of the present invention is that the line segments are interconnected to form a single, integrated, anchoring structure, so as to eliminate the unbalanced heat transfer problem that may be experienced with the prior art multiple-anchoring structure.

Another advantage with the multiple-line-segment single anchoring structure of the present invention is that the difference in thermal expansion coefficients will allow the thermal expansion of neighboring line segments of the single anchoring structure to exert a clamping force with respect to the dielectric layer within which they are enclosed. Such a clamping force further provide a stablizing force to keep the bond pad from being lifted off during the wire bonding process.

To form the metal bond pad with the multiple line segments but single anchoring structure of the present invention, a dielectric layer is first formed on the surface of a wafer, which typically contains a metal layer, a polysilicon layer, or even another insulative layer. The dielectric layer is etched using a conventional photolithography technique to form a single through-hole having the shape of the anchoring structure. Then the through-hole is filled with a metal material by metal deposition, preferably using the same photoresist. Finally, the photoresist is removed and a metal bond pad is formed on the anchoring structure, as well as on a small portion of the dielectric layer.

As discussed in a co-pending application by the same inventors, crack growth in the edge portion of the dielectric layer is one of the main reasons contributing to the bond pad peel-off. The present invention can be further modified by incorporating one or more dendritic sub-structures from the edge portion of the anchoring structure. This can be achieved simply by forming one or more dendritically-shaped through holes extending from the edge portion of the anchoring structure. The dendritically shaped through holes are then filled with the metal material during the deposition of the anchoring structure.

The dendritic sub-structure described above can serve two main purposes. First, it further increases the contact area with the dielectric layer as well as the underlying layer. But more importantly, the dendritic sub-structure creates a discontinuity in the edge portion of the dielectric layer which, when laid out properly, can effectively intercept and thus stop the growth of cracks after they are formed.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an anchored bond pad structure for use in wire bonding applications during the packaging operation of integrated circuit devices, without introducing other unnecessary problems. One of the advantages of the novel bond pad structure disclosed in the present invention is that it eliminates the potential unbalanced heat transfer problems that can be experienced associated with the use of the isolated multiple metal-filled anchors as utilized in the prior art anchored bond pads. Furthermore, the single anchoring structure of the present invention can be modified to provide one or more dendritic sub-structures which can provide additional adhesion force and also effectively stop the growth of cracks when they are formed in the edge portion of the dielectric layer adjacent to the bond pad. Crack growth is also another important reason contributing to the bond peel-off.

Figure 1:
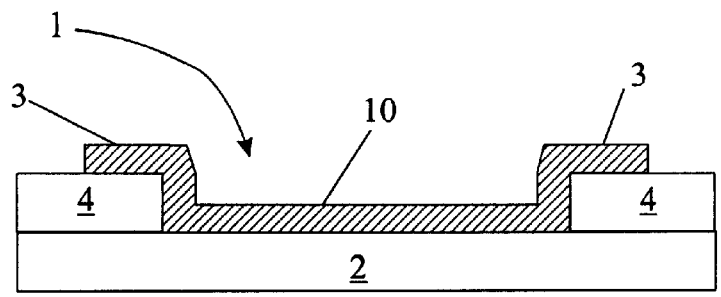
FIG. 1 is an illustrative schematic diagram showing a side view of a conventional bond pad structure without any anchoring structure.

FIG. 1 is an illustrative schematic diagram showing a side view of a conventional bond pad structure without any anchoring structure. Unlike many prior art designs, the present invention can be advantageously implemented in a wide variety of bond pad configurations, from the simplest to the very complicated. FIG. 1, which shows that a bond pad 10 is formed directly on a polysilicon layer 2, illustrates such flexibility. Typically, the bond pad metal layer 1 is extended to form an overhang portion 3 on top of the dielectric layer 4 to provide an extra adhesion force between the two. During wire bonding operations, cracks can develop underneath the overhang portion. As a result, the bond pad metal layer 1 may be peeled off when the vibrational or thermal stress exceeds the limited adhesion force.

Figure 2:
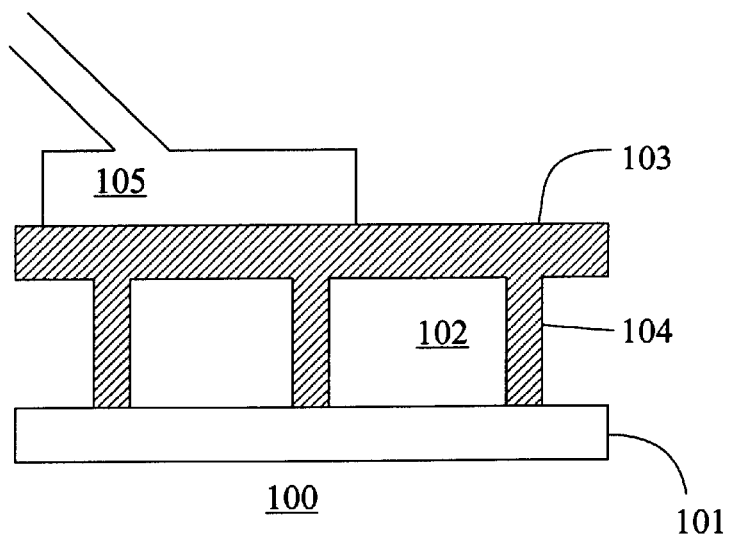
FIG. 2 is an illustrative schematic diagram showing a side view of a prior art bond pad structure having multiple anchoring structures.

Most of the improved bond pad designs disclosed in the prior art intended to alleviate the bond pad peel-off problem have been using a general concept which involves the steps of: (1) depositing a dielectric layer on a metal or polysilicon layer, (2) forming a plurality of metal-filled vias or anchors in the insulation layer, and (3) forming the bond pad metal on top of the insulation layer in contact with those metal-filled vias and anchors. FIG. 2 is an illustrative schematic diagram showing a side view of a prior art bond pad structure having multiple anchoring structures. The metal bond pad 103 is connected to the underlying layer 101 via a plurality of anchoring structures 104, which are buried within a dielectric layer 102. During wiring bonding operation, heat is transferred to the anchoring structures via the bonding wire 105. As discussed above, essentially all of the inventions discussed above involve forming isolated multiple metal-filled holes or vias through the insulation layer underneath the portion of the bond pad where bonding wire is to be attached wherein the heat rise is expected to be high. The multiple metal-filled vias are not interconnected to each other except indirectly at the top thereof through their respective connections to the metal layer. If the multiple metal-filled vias are not laid out properly, or if the wire bonding is not applied on the location as designed, unequal heat transfers from the metal bond pad layer in the different metal-filled vias can occur. Since everything is scaled down proportionally, this unnbalanced heat transfer cause undesirable thermal stress problems.

Figure 3:
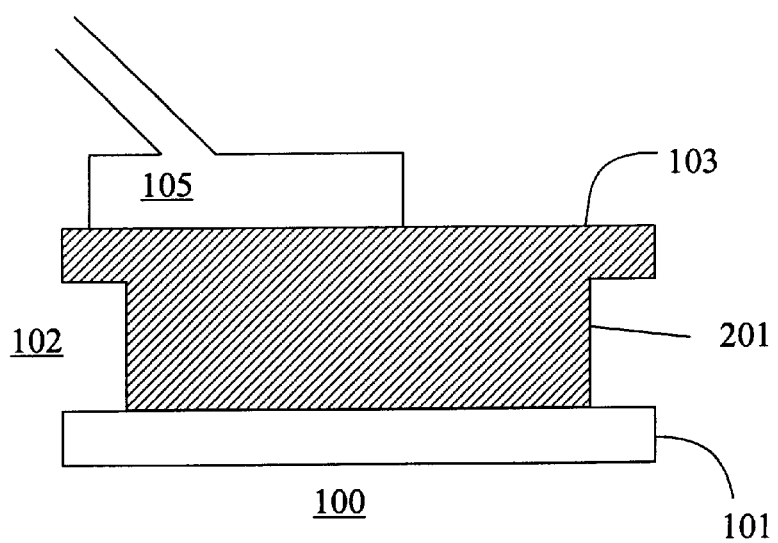
FIG. 3 is an illustrative schematic diagram showing a side view of the improved bond pad structure of the present invention having a single anchoring structure.

FIG. 3 is an illustrative schematic diagram showing a side view of the improved bond pad structure of the present invention having a single anchoring structure 201. In the novel bond pad structure of the present invention, unlike any of the prior art augmented bond pad, a single anchoring structure is provided which is buried within a dielectric layer and is in contact with an underlying layer, which can be a polysilicon layer or other non-conducting or semiconducting layer with good adhesion to the metal material. The single anchoring structure disclosed in the present invention contains a plurality of interconnected line segments (which can be a curve or a straight line). The interconnected line segments are of the same thickness, and generally of the same width. The anchoring structure provides enhanced contacting surface with the underlying layer, so as to provide improved adhesion with the metal material. Additionally, the anchoring structure also creates enhanced contacting surface (which is vertically extending) between the metal bond pad structure and the dielectric layer. This also increases the adhesion force therebetween.

The single anchoring structure of the present invention can assume a variety of shapes, such as an open-ring structure, a closed-ring structure, both of which with radiating whiskers, a coil, an open or closed square-waved ring, a tree structure, a grid-line structure, a meandering structure, a serpentine structure, a spiral structure, a labyrinth, etc. One of the key elements of the present invention is that the line segments be interconnected to form a single anchoring structure, so as to eliminate the unbalanced heat transfer problem that may be experienced with the prior art multiple-anchoring structure.

As discussed above, another advantage with the multiple-line-segment single anchoring structure of the present invention is that the difference in thermal expansion coefficients will allow the thermal expansion of neighboring line segments of the single anchoring structure to exert a clamping force with respect to the dielectric layer within which they are enclosed. Such a clamping force further provide a stablizing force to keep the bond pad from being lifted off during the wire bonding process. In order to adequately balance heat transfer, the single anchoring structure must either allow multiple interceptions by a fictitious line drawn in the radial direction (such as a coil-shaped anchoring structure), or contain a plurality of line segments generally in the radial direction (such as rings with whiskers).

To form the metal bond pad with the multiple line segments but single anchoring structure of the present invention, a dielectric layer is first formed on the surface of a wafer, which typically contains a metal layer, a polysilicon layer, or even another insulative layer on a silicon substrate. The dielectric layer is etched using a conventional photolithography technique to form a single through-hole having the shape of the anchoring structure. Then the through-hole is filled with a metal material by metal deposition, preferably using the same photoresist. Finally, the photoresist is removed and a metal bond pad is formed on the anchoring structure, as well as on a small portion of the dielectric layer.

The present invention can be further modified by incorporating one or more dendritic sub-structures from the edge portion of the anchoring structure. This can be achieved simply by forming one or more dendritically-shaped through holes extending from the edge portion of the anchoring structure. The dendritically shaped through holes are then filled with the metal material during the deposition of the anchoring structure. As discussed in a co-pending application by the same inventors, crack growth in the edge portion of the dielectric layer is one of the main reasons contributing to the bond pad peel-off. The dendritic sub-structure further increases the contact area with the dielectric layer as well as the underlying layer. But more importantly, the dendritic sub-structure creates a discontinuity in the edge portion of the dielectric layer which, when laid out properly, can effectively intercept and thus stop the growth of cracks after they are formed.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 4:
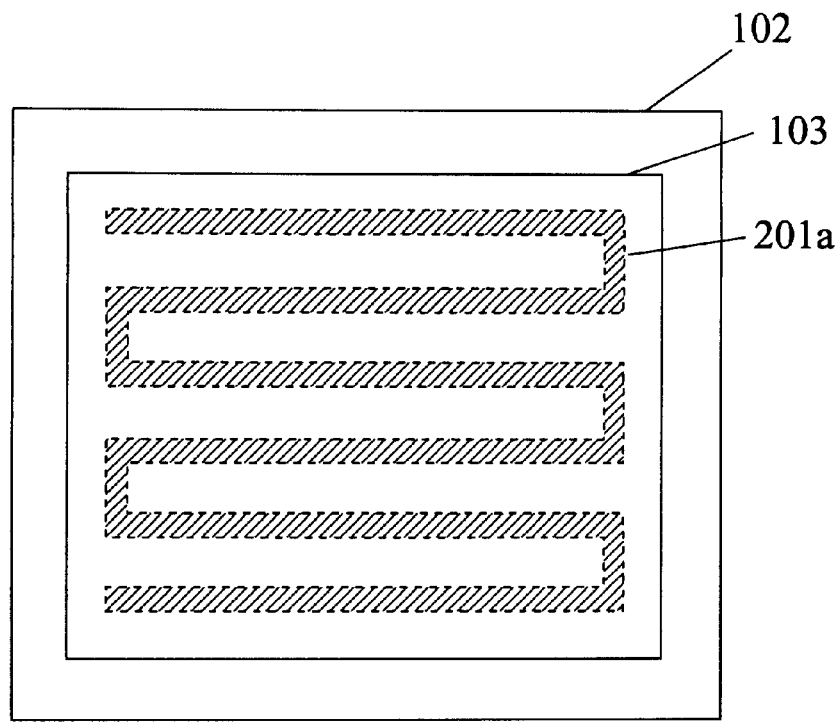
FIG. 4 is an illustrative schematic diagram showing a plan view of an improved bond pad structure of the present invention having a single serpentine-shaped anchoring structure.

FIG. 4 is an illustrative schematic diagram showing a plan view of an improved bond pad structure of the present invention having a single serpentine-shaped anchoring structure 201a which is formed underneath the metal bond pad 103 and is buried within the dielectric layer. As discussed above, unlike prior art anchoring structures, which always contain a plurality of isolated anchors, the serpentine-shaped anchoring structure is a single structure containing a plurality of interconnected line segments. Each line segment can be considered as any portion of the serpentine-shaped anchoring structure between bends.

EXAMPLE 2

Figure 5:
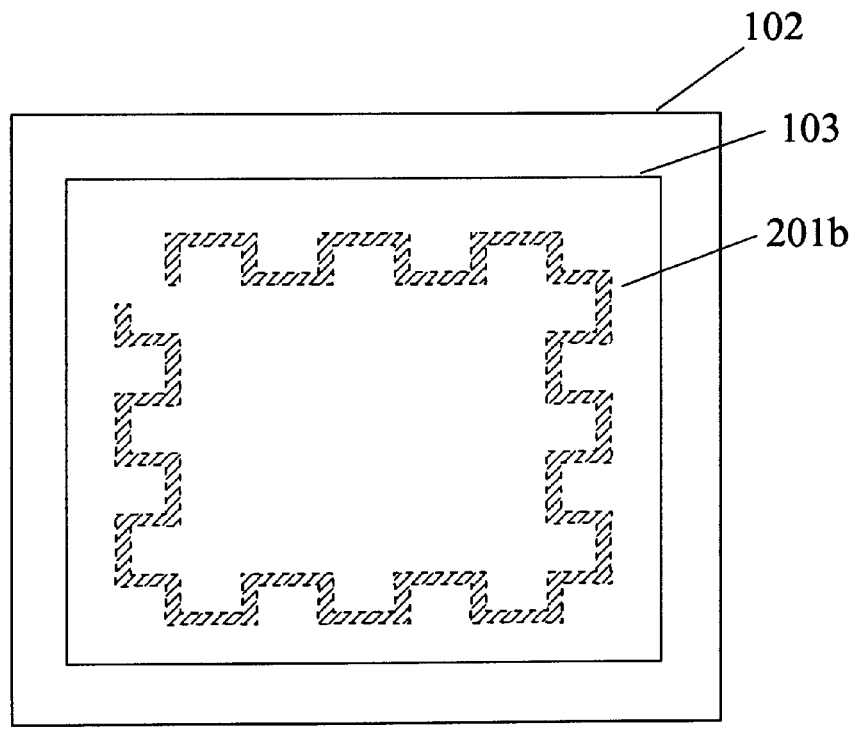
FIG. 5 is an illustrative schematic diagram showing a plan view of an improved bond pad structure of the present invention having a single square-wave-shaped anchoring structure.

FIG. 5 is an illustrative schematic diagram showing a plan view of an improved bond pad structure of the present invention having a single square-wave-shaped anchoring structure 201b.

EXAMPLE 3

Figure 6:
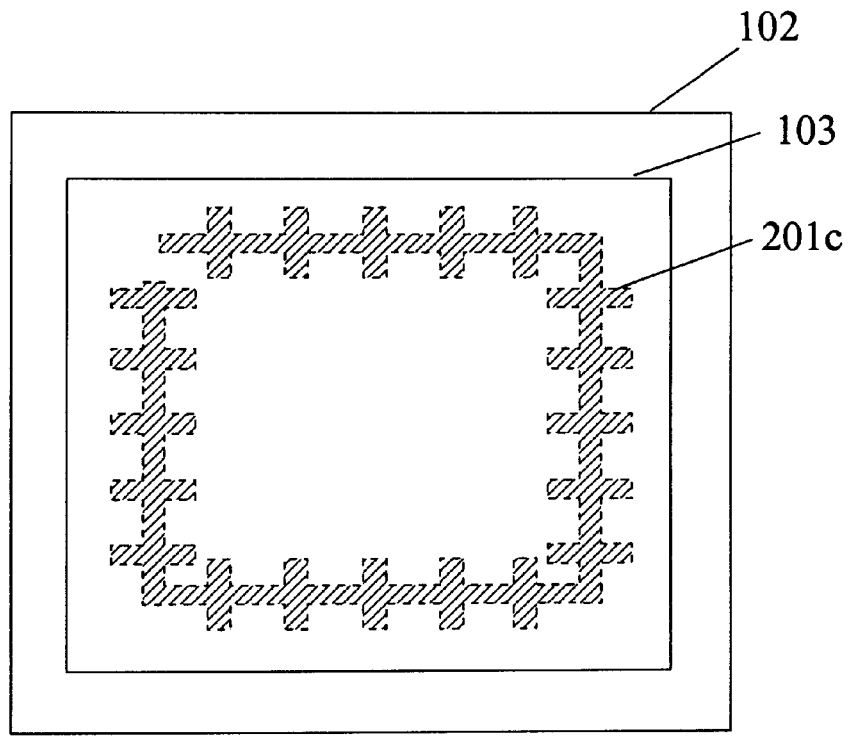
FIG. 6 is an illustrative schematic diagram showing a plan view of an improved bond pad structure of the present invention having a single open-ring-shaped anchoring structure with whiskers.

FIG. 6 is an illustrative schematic diagram showing a plan view of an improved bond pad structure of the present invention having a single open-ring-shaped anchoring structure with whiskers 201c. The whiskers allow better thermal connection with the heat source.

EXAMPLE 4

Figure 7:
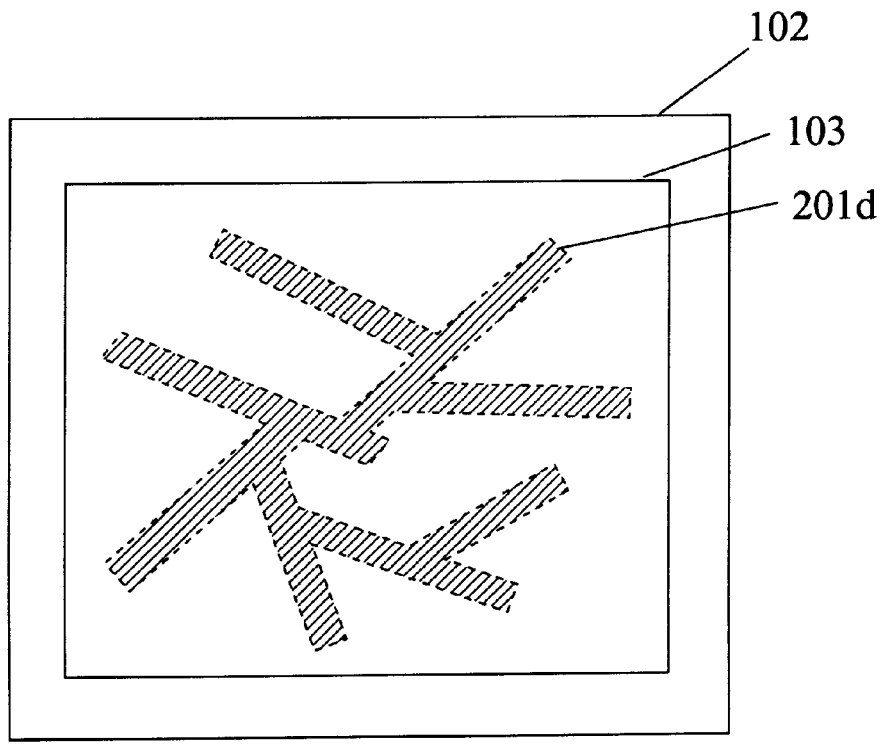
FIG. 7 is an illustrative schematic diagram showing a plan view of an improved bond pad structure of the present invention having a single tree-shaped anchoring structure.

FIG. 7 is an illustrative schematic diagram showing a plan view of an improved bond pad structure of the present invention having a single tree-shaped anchoring structure 201d.

EXAMPLE 5

Figure 8:
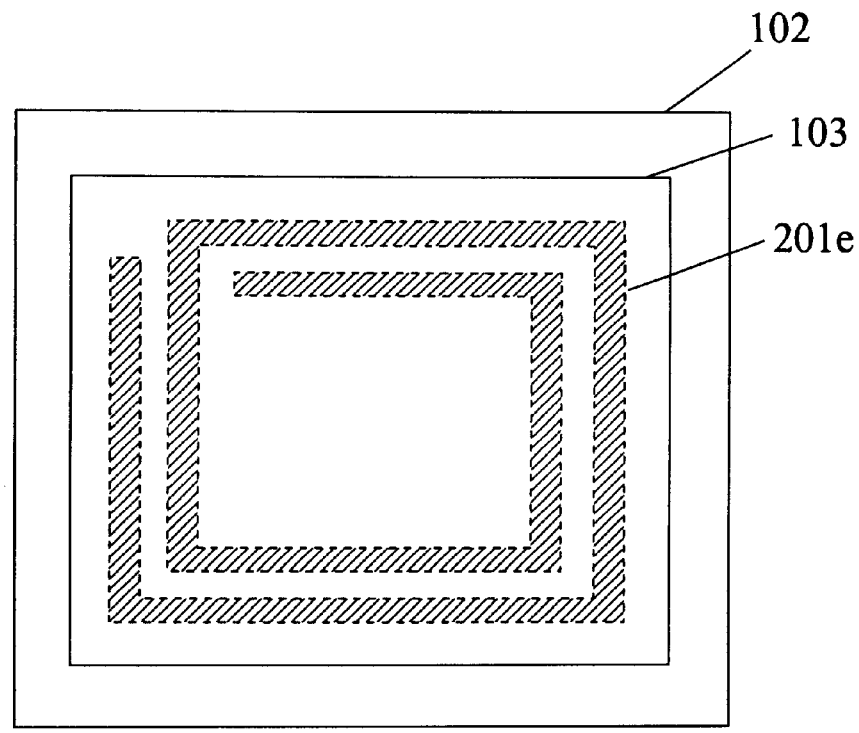
FIG. 8 is an illustrative schematic diagram showing a plan view of an improved bond pad structure of the present invention having a single coil-shaped anchoring structure.

FIG. 8 is an illustrative schematic diagram showing a plan view of an improved bond pad structure of the present invention having a single coil-shaped anchoring structure 201e.

EXAMPLE 6

Figure 9:
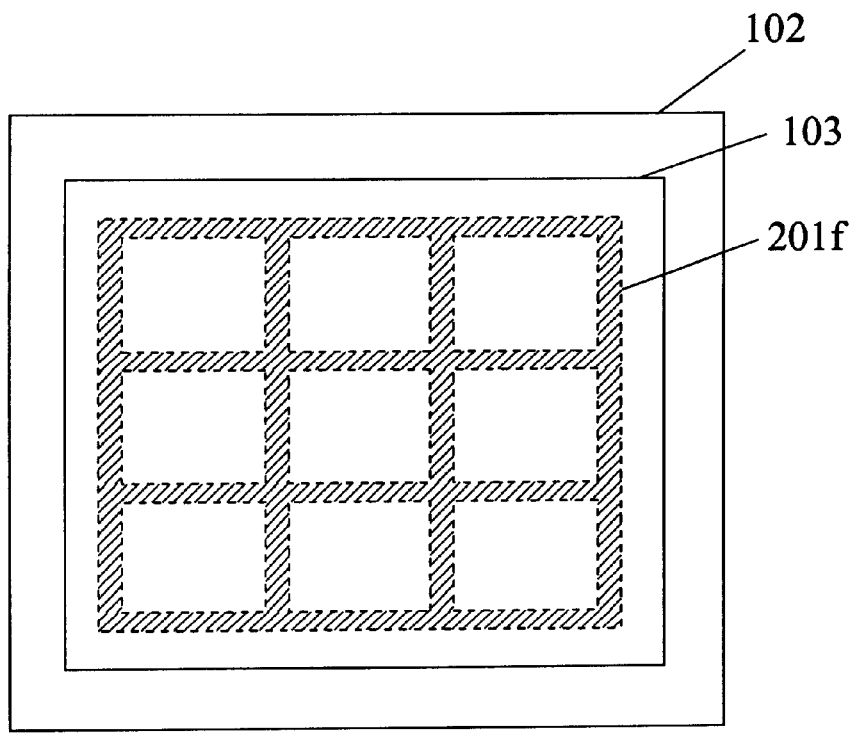
FIG. 9 is an illustrative schematic diagram showing a plan view of an improved bond pad structure of the present invention having a single grid-line-shaped anchoring structure.

FIG. 9 is an illustrative schematic diagram showing a plan view of an improved bond pad structure of the present invention having a single grid-line-shaped anchoring structure 201*f*.

EXAMPLE 7

Figure 10:
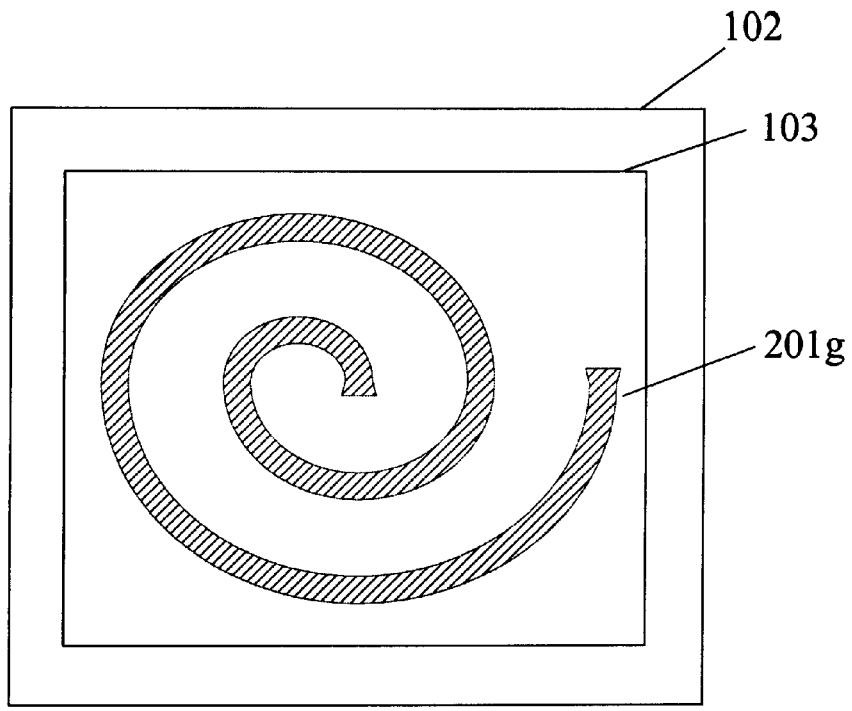
FIG. 10 is an illustrative schematic diagram showing a plan view of an improved bond pad structure of the present invention having a single spiral-shaped anchoring structure.

FIG. 10 is an illustrative schematic diagram showing a plan view of an improved bond pad structure of the present invention having a single spiral-shaped anchoring structure 201*g*. The line segments can be curved line segments as in the spiral.

EXAMPLE 8

Figure 11:
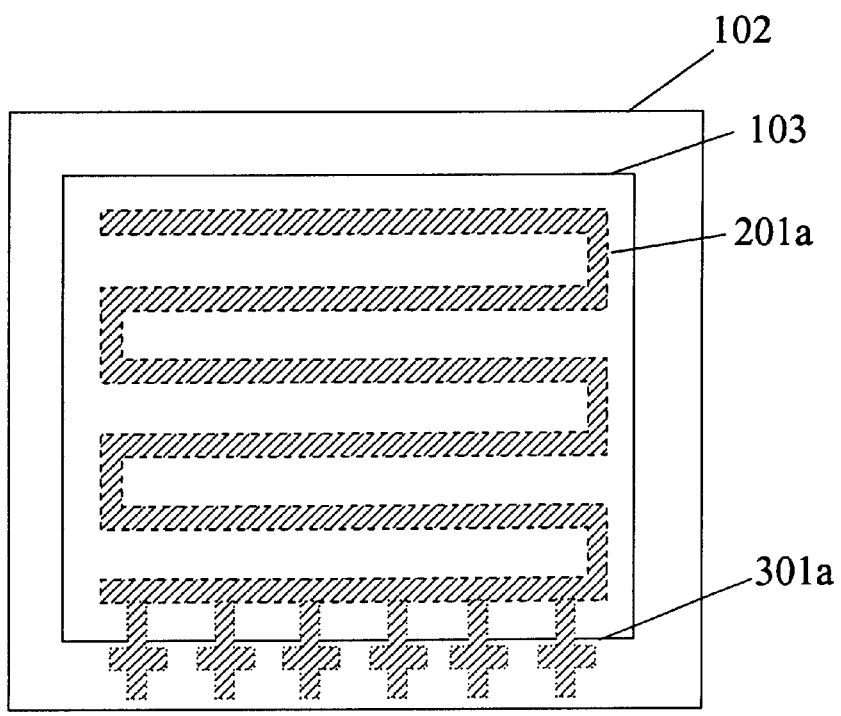
FIG. 11 is an illustrative schematic diagram showing a plan view of an improved bond pad structure of the present invention having same serpentine-shaped anchoring structure as that shown in FIG. 5, except it also contains an array of dendritic sub-structure extending into an edge portion of the dielectric layer.

FIG. 11 is an illustrative schematic diagram showing a plan view of an improved bond pad structure of the present invention having same serpentine-shaped anchoring structure 201 as that shown in FIG. 5, except it also contains an array of dendritic sub-structure 301*a* extending into an edge portion of the dielectric layer.

EXAMPLE 9

Figure 12:
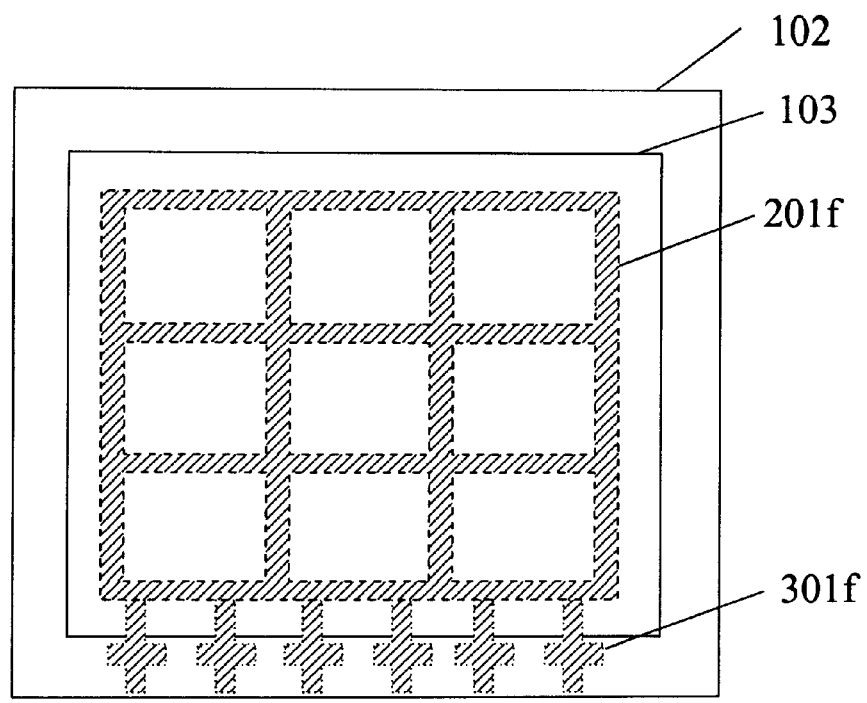
FIG. 12 is an illustrative schematic diagram showing a plan view of an improved bond pad structure of the present invention having same grid-line-shaped anchoring structure as that shown in FIG. 9, except it also contains an array of dendritic sub-structure extending into an edge portion of the dielectric layer.

FIG. 12 is an illustrative schematic diagram showing a plan view of an improved bond pad structure of the present invention having same grid-line-shaped anchoring structure 201*f* as that shown in FIG. 9, except it also contains an array of dendritic sub-structure 301*f* extending into an edge portion of the dielectric layer.

EXAMPLE 10

Figure 13:
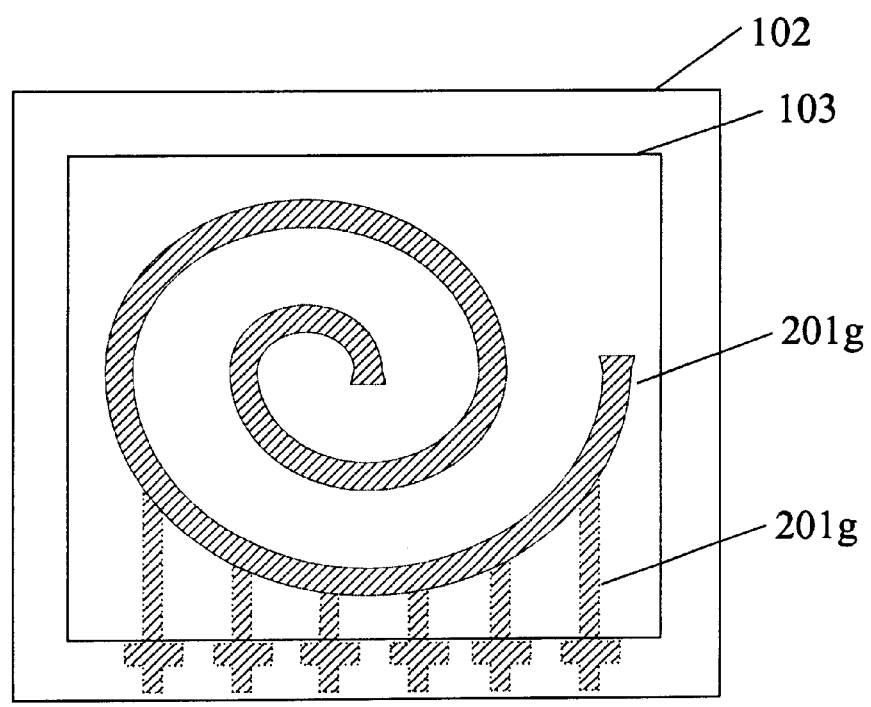
FIG. 13 is an illustrative schematic diagram showing a plan view of an improved bond pad structure of the present invention having same spiral-shaped anchoring structure as that shown in FIG. 10, except it also contains an array of dendritic sub-structure extending into an edge portion of the dielectric layer.

FIG. 13 is an illustrative schematic diagram showing a plan view of an improved bond pad structure of the present invention having same spiral-shaped anchoring structure 201*g* as that shown in FIG. 10, except it also contains an array of dendritic sub-structure 301*g* extending into an edge portion of the dielectric layer.

EXAMPLE 11

Figure 14:
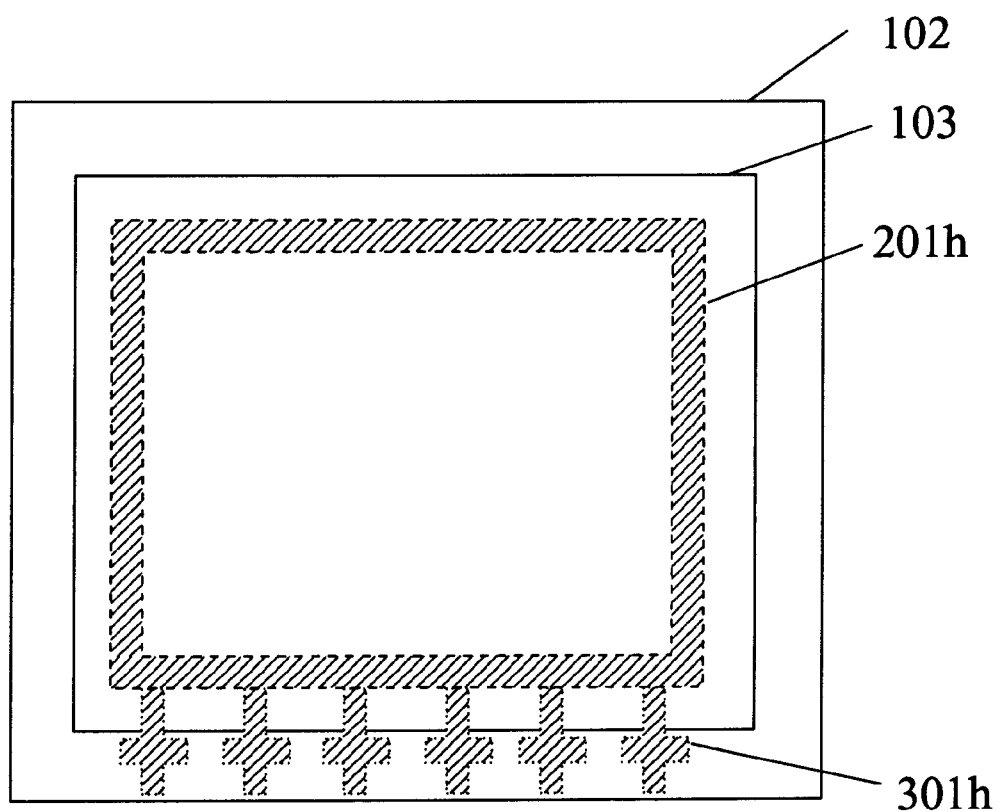
FIG. 14 is an illustrative schematic diagram showing a plan view of an improved bond pad structure of the present invention having a close-square-ring-shaped anchoring structure and an array of dendritic sub-structure extending from one edge of the square ring into an edge portion of the dielectric layer.

FIG. 14 is an illustrative schematic diagram showing a plan view of an improved bond pad structure of the present invention having a close-square-ring-shaped anchoring structure 201*h* and an array of dendritic sub-structure 301*h* extending from one edge of the square ring into an edge portion of the dielectric layer.

Figure 15:
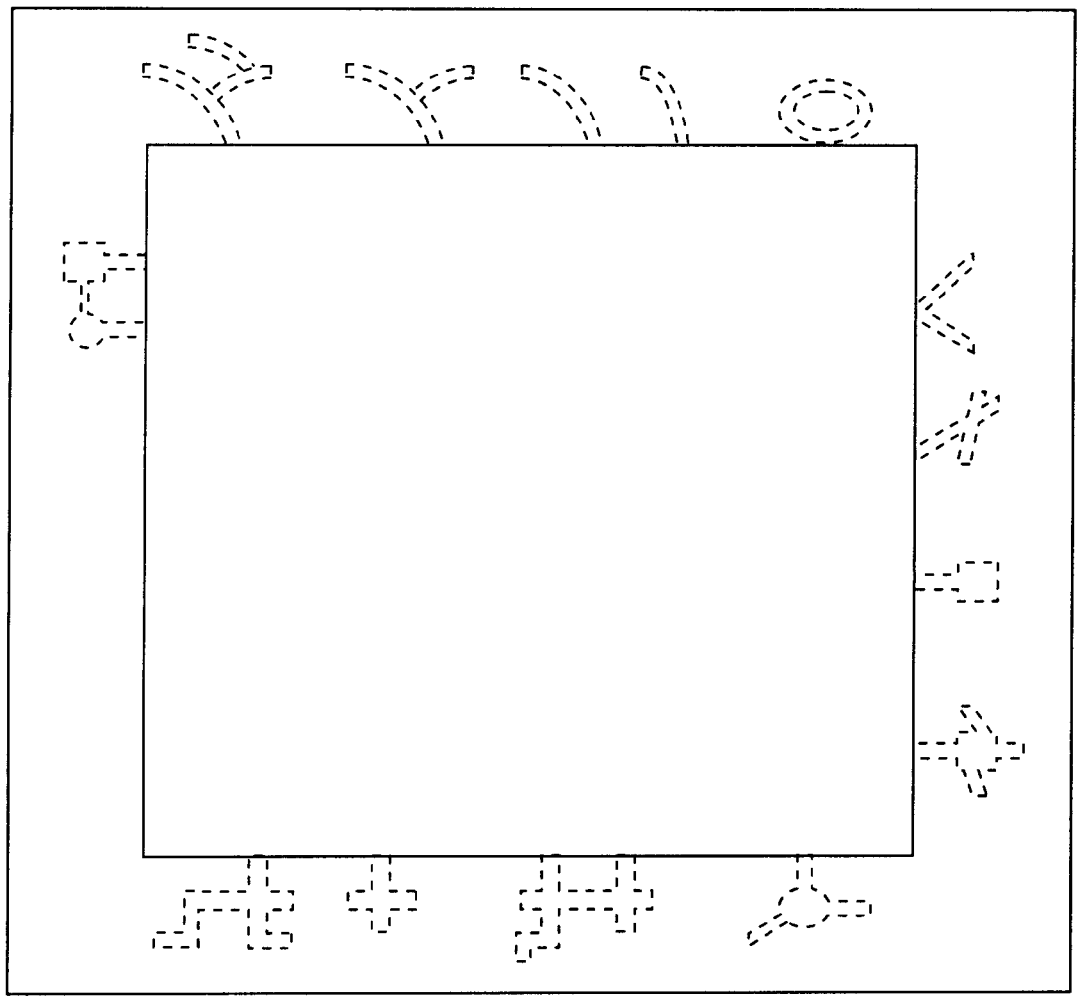
FIG. 15 is an illustrative schematic drawing showing that the dendritic sub-structure can be of any arbitrary shape; it can contain an elongated curved segment, an elongated straight segment, a bulky segment connected to said metal bond pad by a straight segment, or a mixture thereof.

FIG. 15 is an illustrative schematic drawing showing that the dendritic sub-structure can be of any arbitrary shape. The main purpose of the dendritic sub-structure is to provide extended surface for adhesion and to improve the shear force, as well as to create a discontinuity in the edge portion of the dielectric layer so as to intercept and stop the growth of cracks that may be formed due to stress. It can contain an elongated curved segment, an elongated straight segment, a bulky segment connected to said metal bond pad by a straight segment, or a mixture thereof. In order to effectively intercept crack growth in the direction perpendicular to the edge of the bond pad, it is preferred that the dendritic sub-structure contains at least a linear segment in the direction parallel to the edge of the bond pad, in addition to a linear segment in the direction perpendicular to the edge of the bond pad.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bond pad structure for use in wire bonding application during the packaging operation of semiconductor devices, comprising:
   (a) a laminated structure containing a metal bond pad layer, a dielectric layer, and an underlying layer formed on a wafer; and
   (b) a single anchoring structure formed in said dielectric layer connecting said metal bond pad layer and said underlying layer; and
   (c) an array of dendritic sub-structures extending from an outer edge of said anchoring structure;
   (d) wherein said single anchoring structure contains a plurality of line segments that are interconnected so as to form said single anchoring structure.

2. The bond pad structure according to claim 1, wherein said line segments are structured such that they either allow multiple interceptions by a fictitious line drawn in a radial direction, or contain a plurality of line segments arranged generally in the radial direction.

3. The bond pad structure according to claim 1, wherein said anchoring structure is an open-ring structure or closed-ring structure with a plurality of whiskers.

4. The bond pad structure according to claim 1, wherein said underlying layer is a polysilicon layer, a metal layer, or an insulative layer.

5. A bond pad structure for use in wire bonding application during the packaging operation of semiconductor devices, comprising:
   (a) a laminated structure containing a metal bond pad layer, a dielectric layer, and an underlying layer formed on a wafer; and
   (b) a single anchoring structure formed in said dielectric layer connecting said metal bond pad layer and said underlying layer;
   (c) wherein said anchoring structure is an open or closed square-waved ring structure.

6. A bond pad structure for use in wire bonding application during the packaging operation of semiconductor devices, comprising:
   (a) a laminated structure containing a metal bond pad layer, a dielectric layers and an underlying layer formed on a wafer; and
   (b) a single anchoring structure formed in said dielectric layer connecting said metal bond pad layer and said underlying layer;
   (c) wherein said anchoring structure is a tree structure.

7. A bond pad structure for use in wire bonding application during the packaging operation of semiconductor devices, comprising:
   (a) a laminated structure containing a metal bond pad layer, a dielectric layer, and an underlying layer formed on a wafer; and
   (b) a single anchoring structure formed in said dielectric layer connecting said metal bond pad layer and said underlying layer;

(c) wherein said anchoring structure is a grid-line structure.

8. A bond pad structure for use in wire bonding application during the packaging operation of semiconductor devices, comprising:
   (a) a laminated structure containing a metal bond pad layer, a dielectric layer, and an underlying layer formed on a wafer; and
   (b) a single anchoring structure formed in said dielectric layer connecting said metal bond pad layer and said underlying layer;
   (c) wherein said anchoring structure is a meandering structure.

9. A bond pad structure for use in wire bonding application during the packaging operation of semiconductor devices, comprising:
   (a) a laminated structure containing a metal bond pad layer, a dielectric layer, and an underlying layer formed on a wafer; and
   (b) a single anchoring structure formed in said dielectric layer connecting said metal bond pad layer and said underlying layer;
   (c) wherein said anchoring structure is a serpentine structure.

10. A bond pad structure for use in wire bonding application during the packaging operation of semiconductor devices, comprising:
    (a) a laminated structure containing a metal bond pad layer, a dielectric layer, and an underlying layer formed on a wafer; and
    (b) a single anchoring structure formed in said dielectric layer connecting said metal bond pad layer and said underlying layer;
    (c) wherein said anchoring structure is a spiral structure.

11. A bond pad structure for use in wire bonding application during the packaging operation of semiconductor devices, comprising:
    (a) a laminated structure containing a metal bond pad layer a dielectric layer, and an underlying layer formed on a wafer; and
    (b) a single anchoring structure formed in said dielectric layer connecting said metal bond pad layer and said underlying layer;
    (c) wherein said anchoring structure is a labyrinth structure.

12. An integrated circuit package which contains an improved bond pad structure with reduced bond pad lift-off problem, said bond pad structure comprising:
    (a) a laminated structure containing a metal bond pad layer, a dielectric layer, and an underlying layer formed on a wafer; and
    (b) a single anchoring structure formed in said dielectric layer connecting said metal bond pad layer and said underlying layer;
    (c) wherein said single anchoring structure contains a plurality of line segments that are interconnected so as to form said single anchoring structure, further wherein said line segments are structured such that they either allow multiple interceptions by a fictitious line drawn in a radial direction, or contain a plurality of line segments arranged generally in the radial direction;
    (d) further wherein said bond pad structure further comprises an array of dendritic sub-structures extending from an outer edge of said anchoring structure.

13. The integrated circuit package according to claim 12, wherein said line segments are linear line segments.

14. The integrated circuit package according to claim 12, wherein said line segments are curved line segments.

15. The integrated circuit package according to claim 12 wherein said anchoring structure has the geometry of an open or closed ring with whiskers, a coil, an open or closed square-waved ring, a tree structure, a grid-line structure, a meandering structure, a serpentine structure, a spiral structure, or a labyrinth.

* * * * *